US011622580B2

United States Patent
Han et al.

(10) Patent No.: US 11,622,580 B2
(45) Date of Patent: Apr. 11, 2023

(54) AEROSOL GENERATION DEVICE AND GENERATION METHOD

(71) Applicant: KT&G CORPORATION, Daejeon (KR)

(72) Inventors: Jung Ho Han, Daejeon (KR); Jae Sung Choi, Hanam-si (KR); Hun Il Lim, Seoul (KR); Tae Hun Kim, Yongin-si (KR); Hyung Jin Jung, Seoul (KR)

(73) Assignee: KT&G CORPORATION, Daejeon (KR)

( * ) Notice: Subject to any disclaimer, the term of this patent is extended or adjusted under 35 U.S.C. 154(b) by 201 days.

(21) Appl. No.: 16/759,893

(22) PCT Filed: Oct. 26, 2018

(86) PCT No.: PCT/KR2018/012774
§ 371 (c)(1),
(2) Date: Apr. 28, 2020

(87) PCT Pub. No.: WO2019/088578
PCT Pub. Date: May 9, 2019

(65) Prior Publication Data
US 2020/0337374 A1   Oct. 29, 2020

(30) Foreign Application Priority Data

Oct. 30, 2017   (KR) .................. 10-2017-0142578
May 23, 2018   (KR) .................. 10-2018-0058596

(51) Int. Cl.
A24F 13/00   (2006.01)
A24F 40/42   (2020.01)
(Continued)

(52) U.S. Cl.
CPC ............ *A24F 40/42* (2020.01); *A24B 15/167* (2016.11); *A24D 1/20* (2020.01); *A24D 3/17* (2020.01);
(Continued)

(58) Field of Classification Search
CPC ...................................................... A24F 47/00
(Continued)

(56) References Cited

U.S. PATENT DOCUMENTS 5,348,027 A   9/1994   Barnes et al.
5,388,594 A   2/1995   Counts et al.
(Continued)

FOREIGN PATENT DOCUMENTS

CA   2 778 903 A1   5/2011
CA   2 970 045 A1   6/2016
(Continued)

OTHER PUBLICATIONS

Extended European Search Report dated Oct. 15, 2021 in European Application No. 18872138.5.
(Continued)

*Primary Examiner* — Phuong K Dinh
(74) *Attorney, Agent, or Firm* — Sughrue Mion, PLLC

(57) ABSTRACT

Provided is an aerosol generation device including: a case into which a cigarette is insertable; a heater arranged in the case and configured to heat the cigarette inserted into the case; a mainstream smoke passage connecting an internal end portion of the cigarette to the outside; and a vaporizer configured to heat a liquid composition to generate aerosol and deliver the aerosol to the mainstream smoke passage, wherein at least a portion of the mainstream smoke passage extends in a direction crossing a longitudinal direction of the cigarette.

6 Claims, 11 Drawing Sheets

(51) Int. Cl.
| | |
|---|---|
| *A24F 40/90* | (2020.01) |
| *A24F 40/46* | (2020.01) |
| *A24B 15/167* | (2020.01) |
| *A24F 40/20* | (2020.01) |
| *A24F 40/30* | (2020.01) |
| *A24D 3/17* | (2020.01) |
| *A24D 1/20* | (2020.01) |
| *A24F 40/60* | (2020.01) |
| *F21V 3/00* | (2015.01) |
| *F21V 5/00* | (2018.01) |
| *G02B 19/00* | (2006.01) |
| *H05B 3/54* | (2006.01) |
| *A24F 40/485* | (2020.01) |
| *A24F 40/10* | (2020.01) |
| *A24F 40/44* | (2020.01) |
| *A24F 40/40* | (2020.01) |
| *A24F 40/57* | (2020.01) |
| *A24F 40/65* | (2020.01) |
| *H05K 1/02* | (2006.01) |
| *H05K 1/14* | (2006.01) |
| *H05K 1/18* | (2006.01) |
| *A24F 40/50* | (2020.01) |
| *A24F 40/95* | (2020.01) |
| *A24F 15/01* | (2020.01) |
| *A24F 40/51* | (2020.01) |
| *F21Y 115/10* | (2016.01) |

(52) U.S. Cl.
CPC .............. *A24F 15/01* (2020.01); *A24F 40/10* (2020.01); *A24F 40/20* (2020.01); *A24F 40/30* (2020.01); *A24F 40/40* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/51* (2020.01); *F21Y 2115/10* (2016.08); *H05K 2201/012* (2013.01); *H05K 2201/0154* (2013.01); *H05K 2201/10219* (2013.01)

(58) Field of Classification Search
USPC .................................. 131/328–329
See application file for complete search history.

(56) References Cited

U.S. PATENT DOCUMENTS

| | | |
|---|---|---|
| 5,408,574 A | 4/1995 | Deevi et al. |
| 5,505,214 A | 4/1996 | Collins et al. |
| 5,555,476 A | 9/1996 | Suzuki et al. |
| 5,665,262 A | 9/1997 | Hajaligol et al. |
| 5,692,525 A | 12/1997 | Counts et al. |
| 5,723,228 A | 3/1998 | Okamoto |
| 5,750,964 A | 5/1998 | Counts et al. |
| 5,878,752 A | 3/1999 | Adams et al. |
| 5,902,501 A | 5/1999 | Nunnally et al. |
| 5,934,289 A | 8/1999 | Watkins et al. |
| 5,949,346 A | 9/1999 | Suzuki et al. |
| 5,970,719 A | 10/1999 | Merritt |
| 6,026,820 A | 2/2000 | Baggett, Jr. et al. |
| 6,615,840 B1 | 9/2003 | Fournier et al. |
| 6,803,550 B2 | 10/2004 | Sharpe et al. |
| 6,810,883 B2 | 11/2004 | Felter et al. |
| 7,082,825 B2 | 8/2006 | Aoshima et al. |
| 7,594,945 B2 | 9/2009 | Kim et al. |
| 7,682,571 B2 | 3/2010 | Kim et al. |
| 7,726,320 B2 | 6/2010 | Robinson et al. |
| 8,205,622 B2 | 6/2012 | Pan |
| 8,558,147 B2 | 10/2013 | Greim et al. |
| 8,602,037 B2 | 12/2013 | Inagaki |
| 8,689,804 B2 | 4/2014 | Fernando et al. |
| 8,833,364 B2 | 9/2014 | Buchberger |
| 8,997,754 B2 | 4/2015 | Tucker et al. |
| 9,084,440 B2 | 7/2015 | Zuber et al. |
| 9,165,484 B2 | 10/2015 | Choi |
| 9,295,286 B2 | 3/2016 | Shin |
| 9,347,644 B2 | 5/2016 | Araki et al. |
| 9,405,148 B2 | 8/2016 | Chang et al. |
| 9,420,829 B2 | 8/2016 | Thorens et al. |
| 9,516,899 B2 | 12/2016 | Plojoux et al. |
| 9,532,600 B2 | 1/2017 | Thorens et al. |
| 9,541,820 B2 | 1/2017 | Ogawa |
| 9,693,587 B2 | 7/2017 | Plojoux et al. |
| 9,713,345 B2 | 7/2017 | Farine et al. |
| 9,814,269 B2 | 11/2017 | Li et al. |
| 9,839,238 B2 | 12/2017 | Worm et al. |
| 9,844,234 B2 | 12/2017 | Thorens et al. |
| 9,848,651 B2 | 12/2017 | Wu |
| 9,854,845 B2 | 1/2018 | Plojoux et al. |
| 9,949,507 B2 | 4/2018 | Flick |
| 9,974,117 B2 | 5/2018 | Qiu |
| 10,070,667 B2 | 9/2018 | Lord et al. |
| 10,104,909 B2 | 10/2018 | Han et al. |
| 10,104,911 B2 | 10/2018 | Thorens et al. |
| 10,136,673 B2 | 11/2018 | Mironov |
| 10,136,675 B2 | 11/2018 | Li et al. |
| 10,143,232 B2 | 12/2018 | Talon |
| 10,238,149 B2 | 3/2019 | Hon |
| 10,390,564 B2 | 8/2019 | Fernando et al. |
| 10,412,994 B2 | 9/2019 | Schennum et al. |
| 10,426,193 B2 | 10/2019 | Schennum et al. |
| 10,548,350 B2 | 2/2020 | Greim et al. |
| 10,555,555 B2 | 2/2020 | Fernando et al. |
| 10,602,778 B2 | 3/2020 | Hu et al. |
| 10,617,149 B2 | 4/2020 | Malgat et al. |
| 10,694,783 B2 | 6/2020 | Jochnowitz |
| 10,701,973 B2 | 7/2020 | Lee |
| 10,757,975 B2 | 9/2020 | Batista et al. |
| 10,842,194 B2 | 11/2020 | Batista et al. |
| 10,973,087 B2 | 4/2021 | Wang et al. |
| 11,051,545 B2 | 7/2021 | Batista et al. |
| 11,051,550 B2 | 7/2021 | Lin et al. |
| 11,147,316 B2 | 10/2021 | Farine et al. |
| 2003/0226837 A1 | 12/2003 | Blake et al. |
| 2004/0089314 A1 | 5/2004 | Felter et al. |
| 2004/0149737 A1 | 8/2004 | Sharpe et al. |
| 2005/0142036 A1 | 6/2005 | Kim et al. |
| 2006/0267614 A1 | 11/2006 | Lee et al. |
| 2007/0007266 A1 | 1/2007 | Sasaki et al. |
| 2007/0074734 A1 | 4/2007 | Braunshteyn et al. |
| 2007/0246382 A1 | 10/2007 | He |
| 2007/0267031 A1 | 11/2007 | Hon |
| 2010/0313901 A1 | 12/2010 | Fernando et al. |
| 2011/0226236 A1 | 9/2011 | Buchberger |
| 2011/0234069 A1 | 9/2011 | Chen et al. |
| 2013/0014772 A1 | 1/2013 | Liu |
| 2013/0228191 A1 | 9/2013 | Newton |
| 2013/0255675 A1 | 10/2013 | Liu |
| 2014/0060554 A1 | 3/2014 | Collett et al. |
| 2014/0069424 A1 | 3/2014 | Poston et al. |
| 2014/0209105 A1 | 7/2014 | Sears et al. |
| 2014/0217085 A1 | 8/2014 | Alima |
| 2014/0261487 A1 | 9/2014 | Chapman et al. |
| 2014/0286630 A1 | 9/2014 | Buchberger |
| 2014/0339509 A1 | 11/2014 | Choi et al. |
| 2014/0345633 A1 | 11/2014 | Talon et al. |
| 2014/0353856 A1 | 12/2014 | Dubief |
| 2015/0020831 A1 | 1/2015 | Weigensberg et al. |
| 2015/0163859 A1 | 6/2015 | Schneider et al. |
| 2015/0223520 A1 | 8/2015 | Phillips et al. |
| 2015/0230521 A1 | 8/2015 | Talon |
| 2015/0282527 A1 | 10/2015 | Henry, Jr. |
| 2015/0327596 A1 | 11/2015 | Alarcon et al. |

(56) References Cited

U.S. PATENT DOCUMENTS

| | | |
|---|---|---|
| 2016/0103364 A1 | 4/2016 | Nam et al. |
| 2016/0128386 A1 | 5/2016 | Chen |
| 2016/0174613 A1 | 6/2016 | Zuber et al. |
| 2016/0205998 A1 | 7/2016 | Matsumoto et al. |
| 2016/0321879 A1 | 11/2016 | Oh et al. |
| 2016/0324216 A1 | 11/2016 | Li et al. |
| 2016/0331030 A1 | 11/2016 | Ampolini et al. |
| 2016/0345625 A1 | 12/2016 | Liu |
| 2017/0020195 A1 | 1/2017 | Cameron |
| 2017/0042227 A1 | 2/2017 | Gavrielov et al. |
| 2017/0055589 A1 | 3/2017 | Fernando et al. |
| 2017/0119051 A1 | 5/2017 | Blandino et al. |
| 2017/0119053 A1 | 5/2017 | Henry, Jr. et al. |
| 2017/0143041 A1 | 5/2017 | Batista et al. |
| 2017/0188634 A1 | 7/2017 | Plojoux et al. |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0303598 A1 | 10/2017 | Li et al. |
| 2017/0325505 A1 | 11/2017 | Force et al. |
| 2017/0347715 A1 | 12/2017 | Mironov et al. |
| 2018/0027878 A1 | 2/2018 | Dendy et al. |
| 2018/0028993 A1 | 2/2018 | Dubief |
| 2018/0160733 A1 | 6/2018 | Leadley et al. |
| 2018/0199630 A1 | 7/2018 | Qiu |
| 2019/0053541 A1* | 2/2019 | Rojo-Calderon ...... A24D 1/002 |
| 2019/0059448 A1 | 2/2019 | Talon |
| 2019/0159524 A1 | 5/2019 | Qiu |
| 2019/0281896 A1 | 9/2019 | Chapman et al. |
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0260790 A1 | 8/2020 | Kaufman et al. |
| 2020/0261000 A1 | 8/2020 | Kim et al. |
| 2020/0305240 A1 | 9/2020 | Holoubek et al. |
| 2020/0329772 A1 | 10/2020 | Kim et al. |
| 2020/0359681 A1 | 11/2020 | Han et al. |
| 2020/0404969 A1 | 12/2020 | Zuber et al. |

FOREIGN PATENT DOCUMENTS

| | | | |
|---|---|---|---|
| CN | 1078621 A | 11/1993 | |
| CN | 1126425 A | 7/1996 | |
| CN | 1190335 A | 8/1998 | |
| CN | 1280661 A | 1/2001 | |
| CN | 1491598 A | 4/2004 | |
| CN | 1633247 A | 6/2005 | |
| CN | 1871987 A | 12/2006 | |
| CN | 101277622 A | 10/2008 | |
| CN | 101324490 A | 12/2008 | |
| CN | 201253138 Y | 6/2009 | |
| CN | 101518361 A | 9/2009 | |
| CN | 201314692 Y | 9/2009 | |
| CN | 101557728 A | 10/2009 | |
| CN | 101637308 A | 2/2010 | |
| CN | 201657047 U | 11/2010 | |
| CN | 201996322 U | 10/2011 | |
| CN | 102264251 A | 11/2011 | |
| CN | 102595943 A | 7/2012 | |
| CN | 202385727 U | 8/2012 | |
| CN | 102665459 A | 9/2012 | |
| CN | 103099319 A | 5/2013 | |
| CN | 202907797 U | 5/2013 | |
| CN | 203040065 U | 7/2013 | |
| CN | 103271447 A | 9/2013 | |
| CN | 103477252 A | 12/2013 | |
| CN | 103519351 A | 1/2014 | |
| CN | 103653257 A | 3/2014 | |
| CN | 103653258 A | 3/2014 | |
| CN | 203492793 U | 3/2014 | |
| CN | 103889258 A | 6/2014 | |
| CN | 103974635 A | 8/2014 | |
| CN | 103974638 A | 8/2014 | |
| CN | 103974640 A | 8/2014 | |
| CN | 103997922 A | 8/2014 | |
| CN | 104146353 A | 11/2014 | |
| CN | 104188110 A | 12/2014 | |
| CN | 104219973 A | 12/2014 | |
| CN | 204120226 U | 1/2015 | |
| CN | 204146340 U | 2/2015 | |
| CN | 104423130 A | 3/2015 | |
| CN | 204317492 U | 5/2015 | |
| CN | 204393344 U | 6/2015 | |
| CN | 104886776 A | 9/2015 | |
| CN | 105188430 A | 12/2015 | |
| CN | 204838003 U | 12/2015 | |
| CN | 105326092 A | 2/2016 | |
| CN | 205072064 U | 3/2016 | |
| CN | 205180371 U | 4/2016 | |
| CN | 205214209 U | 5/2016 | |
| CN | 105722416 A | 6/2016 | |
| CN | 205358225 U | 7/2016 | |
| CN | 105852221 A | 8/2016 | |
| CN | 105852225 A | 8/2016 | |
| CN | 205456064 U | 8/2016 | |
| CN | 205624474 U | 10/2016 | |
| CN | 106136331 A | 11/2016 | |
| CN | 106163304 A | 11/2016 | |
| CN | 106170215 A | 11/2016 | |
| CN | 205671480 U | 11/2016 | |
| CN | 106231934 A | 12/2016 | |
| CN | 106235419 A | 12/2016 | |
| CN | 205831079 U | 12/2016 | |
| CN | 106418729 A | 2/2017 | |
| CN | 106473232 A | 3/2017 | |
| CN | 106473233 A | 3/2017 | |
| CN | 106490686 A | 3/2017 | |
| CN | 106535680 A | 3/2017 | |
| CN | 106690427 A | 5/2017 | |
| CN | 106723379 A | 5/2017 | |
| CN | 106793834 A | 5/2017 | |
| CN | 206197012 U | 5/2017 | |
| CN | 106912985 A | 7/2017 | |
| CN | 206314585 U | 7/2017 | |
| CN | 106998816 A | 8/2017 | |
| CN | 107105772 A | 8/2017 | |
| CN | 206442590 U | 8/2017 | |
| CN | 206443202 U | 8/2017 | |
| CN | 206443214 U | 8/2017 | |
| CN | 107173850 A | 9/2017 | |
| CN | 107183789 A | 9/2017 | |
| CN | 206462413 U | 9/2017 | |
| CN | 107249366 A | 10/2017 | |
| CN | 107278125 A | 10/2017 | |
| CN | 206547882 U | 10/2017 | |
| CN | 107801375 A | 3/2018 | |
| CN | 108013512 A | 5/2018 | |
| CN | 110325058 A | 10/2019 | |
| CN | 110958841 A | 4/2020 | |
| EA | 201290392 A1 | 10/2012 | |
| EA | 201290240 A1 | 12/2012 | |
| EA | 026076 B1 | 2/2017 | |
| EP | 0 438 862 A2 | 7/1991 | |
| EP | 0 917 831 A1 | 5/1999 | |
| EP | 0 822 760 B1 | 6/2003 | |
| EP | 1 947 965 A2 | 7/2008 | |
| EP | 2 201 850 A1 | 6/2010 | |
| EP | 2 316 286 A1 | 5/2011 | |
| EP | 2 327 318 A1 | 6/2011 | |
| EP | 2 340 729 A1 | 7/2011 | |
| EP | 2368449 A1 | 9/2011 | |
| EP | 2 677 273 A1 | 12/2013 | |
| EP | 2 921 065 A1 | 9/2015 | |
| EP | 3 104 721 | 12/2016 | |
| EP | 3 257 386 B1 | 6/2019 | |
| EP | 3 248 486 B1 | 8/2019 | |
| EP | 3 569 076 A1 | 11/2019 | |
| EP | 3 248 485 B1 | 4/2020 | |
| EP | 3 656 229 A2 | 5/2020 | |
| GB | 2 301 894 A | 12/1996 | |

(56) References Cited

FOREIGN PATENT DOCUMENTS

| | | |
|---|---|---|
| GB | 2514893 A | 12/2014 |
| JP | S48-63677 U | 8/1973 |
| JP | 62-15793 A | 1/1987 |
| JP | S63-68690 U | 5/1988 |
| JP | 6-73784 U | 10/1994 |
| JP | 7-72809 A | 3/1995 |
| JP | 7-184627 A | 7/1995 |
| JP | 9-75058 A | 3/1997 |
| JP | 9-161822 A | 6/1997 |
| JP | 9-228919 A | 9/1997 |
| JP | 10-37781 A | 2/1998 |
| JP | 2002-514910 A | 5/2002 |
| JP | 2003-527127 A | 9/2003 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2012-513750 A | 6/2012 |
| JP | 2013-509160 A | 3/2013 |
| JP | 2013-524835 A | 6/2013 |
| JP | 2014-132560 A | 7/2014 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-127300 A | 7/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-2017-0057535 A | 5/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/117702 A1 | 8/2015 |
| WO | 2015/174657 A1 | 11/2015 |
| WO | 2015/177046 A1 | 11/2015 |
| WO | 2015168828 A1 | 11/2015 |
| WO | 2015/189388 A1 | 12/2015 |
| WO | 2016/005601 A1 | 1/2016 |
| WO | 2016/009202 A1 | 1/2016 |
| WO | 2016/012795 A1 | 1/2016 |
| WO | 2016/091658 A1 | 6/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001520 A1 | 1/2017 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Communication dated Dec. 3, 2021 from the Chinese Patent Office in Chinese Application No. 201880049465.2.

Communication dated Dec. 2, 2021 from the Chinese Patent Office in Chinese Application No. 201880048657.1.

(56) References Cited

OTHER PUBLICATIONS

Communication dated Dec. 2, 2021 from the Chinese Patent Office in Chinese Application No. 201880048444.9.
Communication dated Feb. 24, 2021 by the Japanese Patent Office in application No. 2020-503962.
Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 2020-501446.
Communication dated Mar. 16, 2021 by the Japanese Patent Office in application No. 2020-521441.
Communication dated Feb. 9, 2021 by the Japanese Patent Office in application No. 2020-501205.
Communication dated Mar. 16, 2021 by the European Patent Office in application No. 18806877.9.
Office Action dated Apr. 5, 2019 in Korean Application No. 10-2019-0017393.
Office Action dated Apr. 25, 2019 in Korean Application No. 10-2019-0033722.
Office Action dated Apr. 25, 2019 in Korean Application No. 10-2019-0033723.
Office Action dated Jun. 7, 2021 in Canadian Application No. 3,076,886.
Office Action dated Feb. 9, 2018 in Korean Application No. 10-2017-0058786.
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Extended European Search Report dated Jan. 15, 2021 in European Application No. 18799246.6.
Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.
Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.
Communication dated Jul. 27, 2020 by the Russian Patent Office in application No. 2020110821.
Communication dated Jun. 11, 2020 by the Korean Patent Office in application No. 10-2018-0051469.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.

(56) References Cited

OTHER PUBLICATIONS

International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng et al., "Technology Manual of a Programmable Controller", Science Technology, 1st Edition, 1996, p. 132 (2 pages total).
Office Action dated Aug. 26, 2022 issued by the Chinese Patent Office in Chinese Application No. 201880048703.8.
Office Action dated Jul. 12, 2022 issued by the Chinese Patent Office in Chinese Application No. 201880049189.X.
Office Action dated Jul. 4, 2022 issued by the Chinese Patent Office in Chinese Application No. 201880048657.1.
Office Action dated Jun. 22, 2022 issued by the Chinese Patent Office in Chinese Application No. 201880048444.9.
Office Action dated Jun. 28, 2022 issued by the Japanese Patent Office in Japanese Application No. 2020-522897.
Su Zuen et al., "Heat Transfer", Dalian Maritime University Press, 1989, pp. 12-13, (9 pages total).
Communication dated Nov. 1, 2022 from the Japanese Patent Office in Application No. 2020-501205.
Communication dated Dec. 20, 2022 from the Japanese Patent Office in Application No. 2021-122551.
Communication dated Dec. 29, 2022 from the China National Intellectual Property Administration in Application No. 201880055847.6.
First Office Action dated Jan. 20, 2023, issued in the Chinese Patent Office in corresponding Chinese Patent Application No. 202010761215.0.
Notice of Reasons for Refusal dated Jan. 10, 2023 in the Japanese Patent Office in corresponding Japanese Patent Application No. 2021-080578.
First Office Action dated Jan. 28, 2023 in the China National Intellectual Property Adminstration in corresponding Chinese Patent Application No. 202010761219.9.
Notice of Reasons for Refusal dated Feb. 14, 2023 in the Japanese Patent Office in corresponding Japanese Patent Application No. 2022-074915.

* cited by examiner

AEROSOL GENERATION DEVICE AND GENERATION METHOD

CROSS REFERENCE TO RELATED APPLICATIONS

This application is a National Stage of International Application No. PCT/KR2018/012774 filed Oct. 26, 2018, claiming priority based on Korean Patent Application No. 10-2017-0142578 filed Oct. 30, 2017 and Korean Patent Application No. 10-2018-0058596 filed May 23, 2018.

TECHNICAL FIELD

The present disclosure relates to an aerosol generation device, and more particularly, to a non-combustion-type aerosol generation device.

BACKGROUND ART

Recently, the demand for alternative methods of overcoming the shortcomings of general cigarettes has increased. For example, there is increasing demand for a method of generating aerosol by heating an aerosol generating material in cigarettes, rather than by burning cigarettes. Accordingly, studies on non-combustion-type aerosol generation devices such as heating-type cigarettes or heating-type aerosol generation devices have been actively conducted.

A non-combustion-type aerosol generation device refers to a device that is configured to heat a cigarette to a certain temperature, instead of burning the cigarette, and generate an aerosol from an aerosol-generating material included in the cigarette, thereby allowing inhalation of the aerosol with air.

A non-combustion-type aerosol generation device detects puffing operation by a user, that is, inhalation of the cigarette by the user, Aerosol generation devices may detect a puff by measuring an inhalation pressure by using a pressure detecting sensor. Since detection of a puffing operation serves as a basis for controlling an aerosol generation device, a structure that allows stable detection of an inhalation pressure is required.

DESCRIPTION OF EXEMPLARY EMBODIMENTS

Technical Problem

Provided is an aerosol generation device having a structure in which an aerosol that is liquefied by passing through an internal air passage is easily delivered to a heater again.

Also provided are an aerosol generation device and a generation method, whereby diverse experiences and convenience during use may be provided by utilizing an aerosol-generation source and a cigarette in combination.

Also provided is an aerosol having abundant flavors and nicotine or the like by allowing the aerosol to pass through a cigarette, wherein the aerosol is generated by heating an aerosol-generation source.

Solution to Problem

According to an exemplary embodiment of the present disclosure, an aerosol generation device includes: a case into which a cigarette is insertable; a heater arranged in the case and configured to heat the cigarette inserted into the case; a mainstream smoke passage connecting an internal end portion of the cigarette to the outside; and a vaporizer configured to generate aerosol by heating a liquid composition and deliver the aerosol to the mainstream smoke passage, wherein at least a portion of the mainstream smoke passage extends in a direction crossing a longitudinal direction of the cigarette.

In the present exemplary embodiment, the mainstream smoke passage may be connected to the cigarette through a first end portion and may be connected to the vaporizer through a second end portion that is opposite to the first end portion.

In the present exemplary embodiment, the mainstream smoke passage may include a first mainstream smoke passage extending in the longitudinal direction of the cigarette and a second mainstream smoke passage extending in a direction crossing a direction in which the first mainstream smoke passage extends.

In the present exemplary embodiment, an inclined surface formed to be inclined with respect to the longitudinal direction of the cigarette may be formed in a connecting portion between the first mainstream smoke passage and the second mainstream smoke passage.

In the present exemplary embodiment, a rounded surface may be formed in a connecting portion between the first mainstream smoke passage and the second mainstream smoke passage.

In the present exemplary embodiment, the heater and the vaporizer may be arranged in series alone the longitudinal direction of the cigarette.

In the present exemplary embodiment, the heater and the vaporizer may be arranged in parallel with respect to the longitudinal direction of the cigarette.

Advantageous Effects of Disclosure

According to the aerosol generation device related to the exemplary embodiments of the present disclosure as described above, an internal air path is inclined in a longitudinal direction of a cigarette, and thus, it is possible to prevent a liquefied aerosol in a liquid state from getting stuck in the internal air path and preventing air flow.

In addition, as an inclined surface or a rounded surface is formed at a point at which the internal air path is bent, it is possible to prevent a liquefied aerosol in a liquid state from getting stuck in the internal air path and preventing air flow.

In addition, after generating an aerosol from an aerosol generation source, the flow of the generated aerosol may be passed through the cigarette to thereby provide the aerosol containing flavors suitable for a user and nicotine.

BEST MODE

Provided is an aerosol generation device including: a case into which a cigarette is insertable; a heater arranged in the case and configured to heat the cigarette inserted into the case; a mainstream smoke passage connecting an internal end portion of the cigarette to the outside; and a vaporizer configured to heat a liquid composition to generate an aerosol and deliver the aerosol to the mainstream smoke passage, wherein at least a portion of the mainstream smoke passage extends in a direction crossing a longitudinal direction of the cigarette.

Mode of Disclosure

With respect to the terms in the various exemplary embodiments of the present disclosure, the general terms which are currently and widely used are selected in consideration of functions of structural elements in the various exemplary embodiments. However, meanings of the terms can be changed according to intention, a judicial precedence, the appearance of a new technology, and the like, in addition, in certain cases, a term which is not commonly used can be selected. In such a case, the meaning of the term will be described in detail at the corresponding portion in the description of the present disclosure. Therefore, the terms used in the various exemplary embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

Hereinafter, the present disclosure will now be described more fully with reference to the accompanying drawings, in which exemplary embodiments of the present disclosure are shown such that one of ordinary skill in the art may easily work the present disclosure. The disclosure can, however, be embodied in many different forms and should not be construed as being limited to the exemplary embodiments set forth herein.

Hereinafter, exemplary embodiments of the present disclosure will be described in detail with reference to the drawings.

Figure 1:
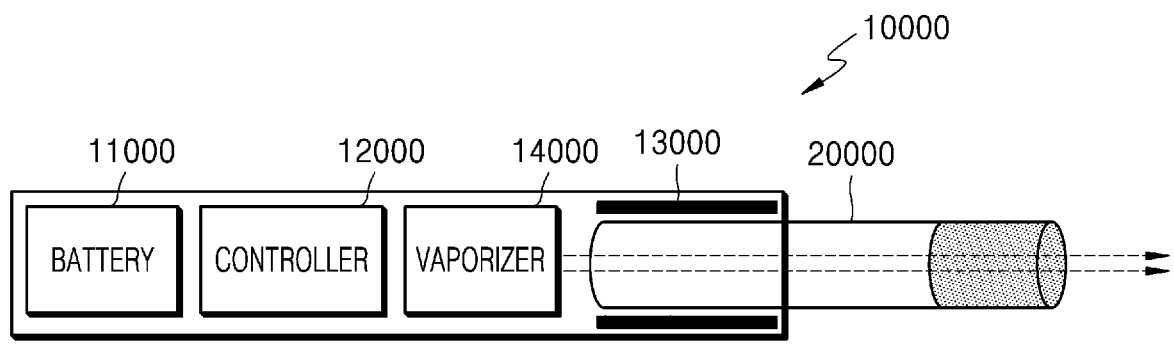
FIGS. 1 and 2 are drawings showing examples in which a cigarette is inserted into an aerosol generating device.
Figure 2:
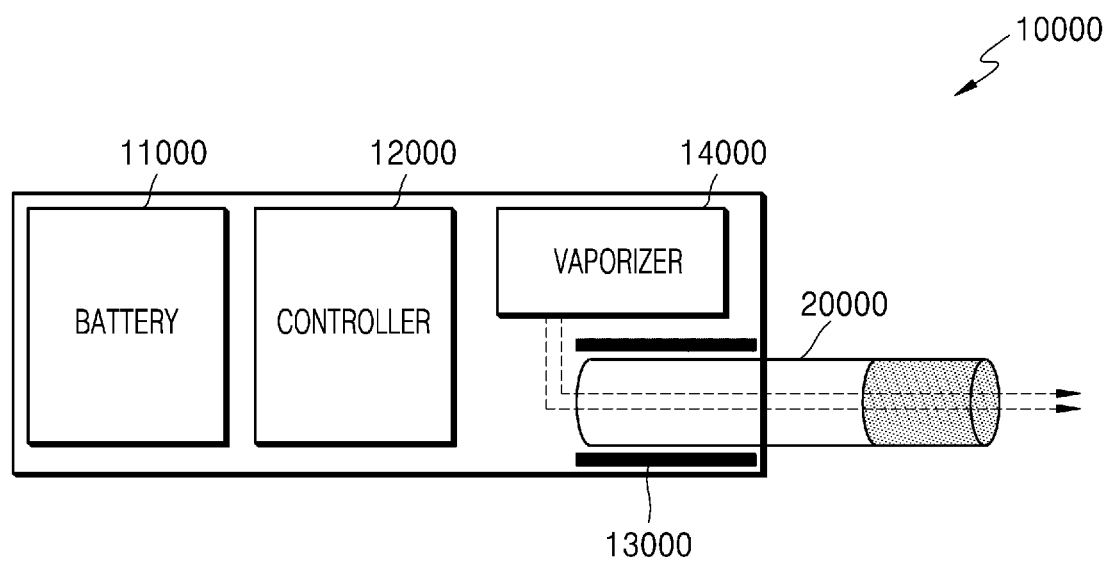

FIGS. 1 and 2 are drawings showing examples in which a cigarette is inserted into an aerosol generating device.

Referring to FIGS. 1 and 2, an aerosol generating device 100 includes a battery 11000, a controller 12000, a heater 13000, and a vaporizer 14000. Also, a cigarette 20000 may be inserted into an inner space of the aerosol generating device 10000.

FIGS. 1 and 2 only illustrate components of the aerosol generating device 10000, which are related to the present exemplary embodiment. Therefore, it will be understood by one of ordinary skill in the art related to the present exemplary embodiment that other general-purpose components may be further included in the aerosol generating device 10000, in addition to the components illustrated in FIG. 1.

Also, FIGS. 1 and 2 illustrate the aerosol generating device 10000 including the heater 13000, However, according to necessity, the heater 13000 may be omitted.

FIG. 1 illustrates that the battery 11000, the controller 12000, the vaporizer 14000, and the heater 13000 are arranged in series. Also, FIG. 2 illustrates that the vaporizer 14000 and the heater 13000 are arranged in parallel. However, the internal structure of the aerosol generating device 10000 is not limited to the structures illustrated in FIG. 1 or FIG. 2. In other words, according to the design of the aerosol generating device 10000, the battery 11000, the controller 12000, the vaporizer 14000, and the heater 13000 may be differently arranged.

When the cigarette 20000 is inserted into the aerosol generating device 10000, the aerosol generating device 10000 may operate the vaporizer 14000 to generate aerosol from the vaporizer 14000. The aerosol generated by the vaporizer 14000 is delivered to the user by passing through the cigarette 20000. The vaporizer 14000 will be described in more detail later.

The battery 11000 may supply power to be used for the aerosol generating device 10000 to operate. For example, the battery 11000 may supply power to heat the heater 13000 or the vaporizer 14000 and may supply power for operating the controller 12000. Also, the battery 11000 may supply power for operations of a display, a sensor, a motor, etc. mounted in the aerosol generating device 10000.

The controller 12000 may generally control operations of the aerosol generating device 10000. In detail, the controller 12000 may control not only operations of the battery 11000, the heater 13000, and the vaporizer 14000, but also operations of other components included in the aerosol generating device 10000. Also, the controller 12000 may check a state of each of the components of the aerosol generating device 10000 to determine whether or not the aerosol generating device 10000 is able to operate.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 13000 may be heated by the power supplied from the battery 11000. For example, when the cigarette 20000 is inserted into the aerosol generating device 10000, the heater 13000 may be located outside the cigarette 20000. Thus, the heated heater 13000 may increase a temperature of an aerosol generating material in the cigarette 20000.

The heater 13000 may include an electro-resistive heater. For example, the heater 13000 may include an electrically conductive track, and the heater 13000 may be heated when currents flow through the electrically conductive track. However, the heater 13000 is not limited to the example described above and may include all heaters which may be heated to a desired temperature. Here, the desired temperature may be pre-set in the aerosol generating device 10000 or may be set as a temperature desired by a user.

As another example, the heater 13000 may include an induction heater. In detail, the heater 13000 may include an electrically conductive coil for heating a cigarette in an induction heating method, and the cigarette may include a susceptor which may be heated by the induction heater.

FIGS. 1 and 2 illustrate that the heater 13000 is positioned outside the cigarette 20000, but the position of the cigarette 20000 is not limited thereto. For example, the heater 13000 may include a tube-type heating element, a plate-type heating element, a needle-type heating element, or a rod-type heating element, and may beat the inside or the outside of the cigarette 20000, according to the shape of the heating element.

Also, the aerosol generating device 10000 may include a plurality of heaters 13000. Here, the plurality of heaters 13000 may be inserted into the cigarette 20000 or may be arranged outside the cigarette 20000. Also, some of the plurality of heaters 13000 may be inserted into the cigarette 20000, and the others may be arranged outside the cigarette 20000. In addition, the shape of the heater 13000 is not limited to the shapes illustrated in FIGS. 1 and 2 and may include various shapes.

The vaporizer 14000 may generate an aerosol by heating a liquid composition and the generated aerosol may pass through the cigarette 20000 to be delivered to a user. In other words, the aerosol generated via the vaporizer 14000 may move along an air flow passage of the aerosol generating device 10000 and the air flow passage may be configured such that the aerosol generated via the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be formed to be detachable from the vaporizer 14000 or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic. fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be positioned as being wound around the liquid delivery element. The heating element may be heated by a current supply and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include general-purpose components in addition to the battery 11000, the controller 12000, and the heater 13000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.), Also, the aerosol generating device 10000 may be formed as a structure where, even when the cigarette 20000 is inserted into the aerosol generating device 10000, external air may be introduced or internal air may be discharged.

Although not illustrated in FIGS. 1 and 2, the aerosol generating device 10000 and an additional cradle may form together a system. For example, the cradle may be used to charge the battery 11000 of the aerosol generating device 10000. Alternatively, the heater 13000 may be heated when the cradle and the aerosol generating device 10000 are coupled to each other.

The cigarette 20000 may be similar as a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, only a portion of the first portion may be inserted into the aerosol generating device 10000. Otherwise, a portion of the first portion and a portion of the second portion may be inserted into the aerosol generating device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 10000. For example, opening and closing of the air passage and/or a size of the air passage may be adjusted by the user. Accordingly, the amount of smoke and a smoking satisfaction may be adjusted by the user. As another example, the external air may flow into the cigarette 20000 through at least one hole formed in a surface of the cigarette 20000.

Figure 3:
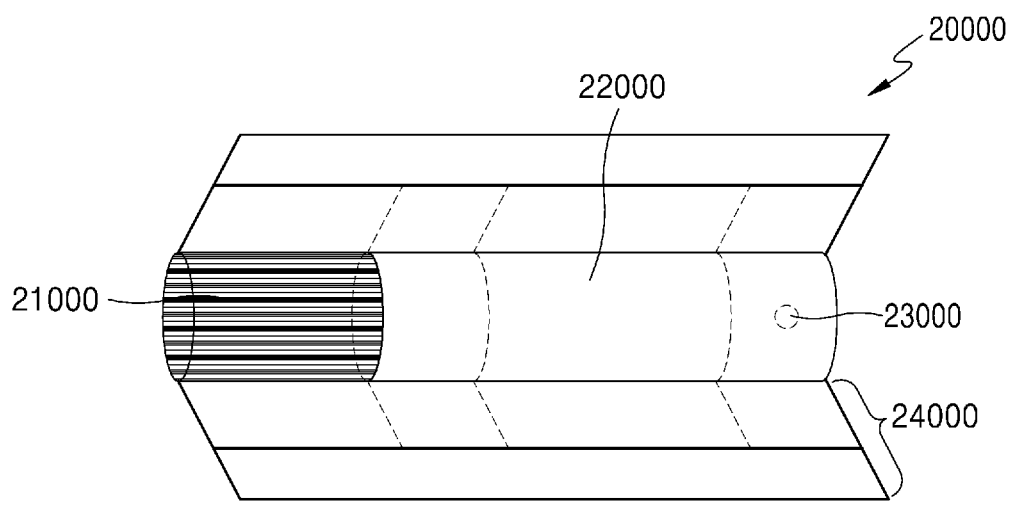
FIG. 3 is a drawing illustrating an example of a cigarette.

Hereinafter, an example of the cigarette 20000 will be described with reference to FIG. 3, FIG. 3 is a drawing illustrating an example of a cigarette.

Referring to FIG. 3, the cigarette 20000 may include a tobacco rod 21000 and a filter rod 22000. The first portion described above with reference to FIGS. 1 and 2 may include the tobacco rod 21000, and the second portion may include the filter rod 22000.

FIG. 3 illustrates that the filter rod 22000 includes a single segment. However, the filter rod 22000 is not limited thereto.

In other words, the filter rod 22000 may include a plurality of segments. For example, the filter rod 22000 may include a first segment configured to cool an aerosol and a second segment configured to filter a certain component included in the aerosol. Also, as necessary, the filter rod 22000 may further include at least one segment configured to perform other functions.

The cigarette 2000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged using separate wrappers, may be coupled to each other, and the entire cigarette 20000 may be packaged using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers may be combined and re-packaged together using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a heat conductive material. For example, the heat-conducting material may be, but is not limited to, a metal foil such as aluminum foil. For example, the heat conductive material surrounding the tobacco rod 21000 may uniformly distribute heat transmitted to the tobacco rod 21000, and thus, the heat conductivity applied to the tobacco rod may be increased and taste of the tobacco may be improved. Also, the heat conductive material surrounding the tobacco rod 21000 may function as a susceptor heated by the induction heater. Here, although not illustrated in the drawings, the tobacco rod 21000 may further include an additional susceptor, in addition to the heat conductive material surrounding the tobacco rod 21000.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a configuration in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material, for forming the cooling segment is not limited thereto. in some exemplary embodiments, the cooling segment may include a cellulose acetate filter having a plurality of holes. However, the cooling segment is not limited to the above-described example and any other cooling segment that is capable of cooling the aerosol may be used.

Although not illustrated in FIG. 3, the cigarette 20000 according to an exemplary embodiment may further include a front-end filter. The front-end filter may be located on a side of the tobacco rod 21000, which is the side not facing the filter rod 22000. The front-end filter may prevent the tobacco rod 21000 from being detached outwards and prevent a liquefied aerosol from flowing into the aerosol generating device 10000 (FIGS. 1 and 2) from the tobacco rod 21000, during smoking.

Figure 4:
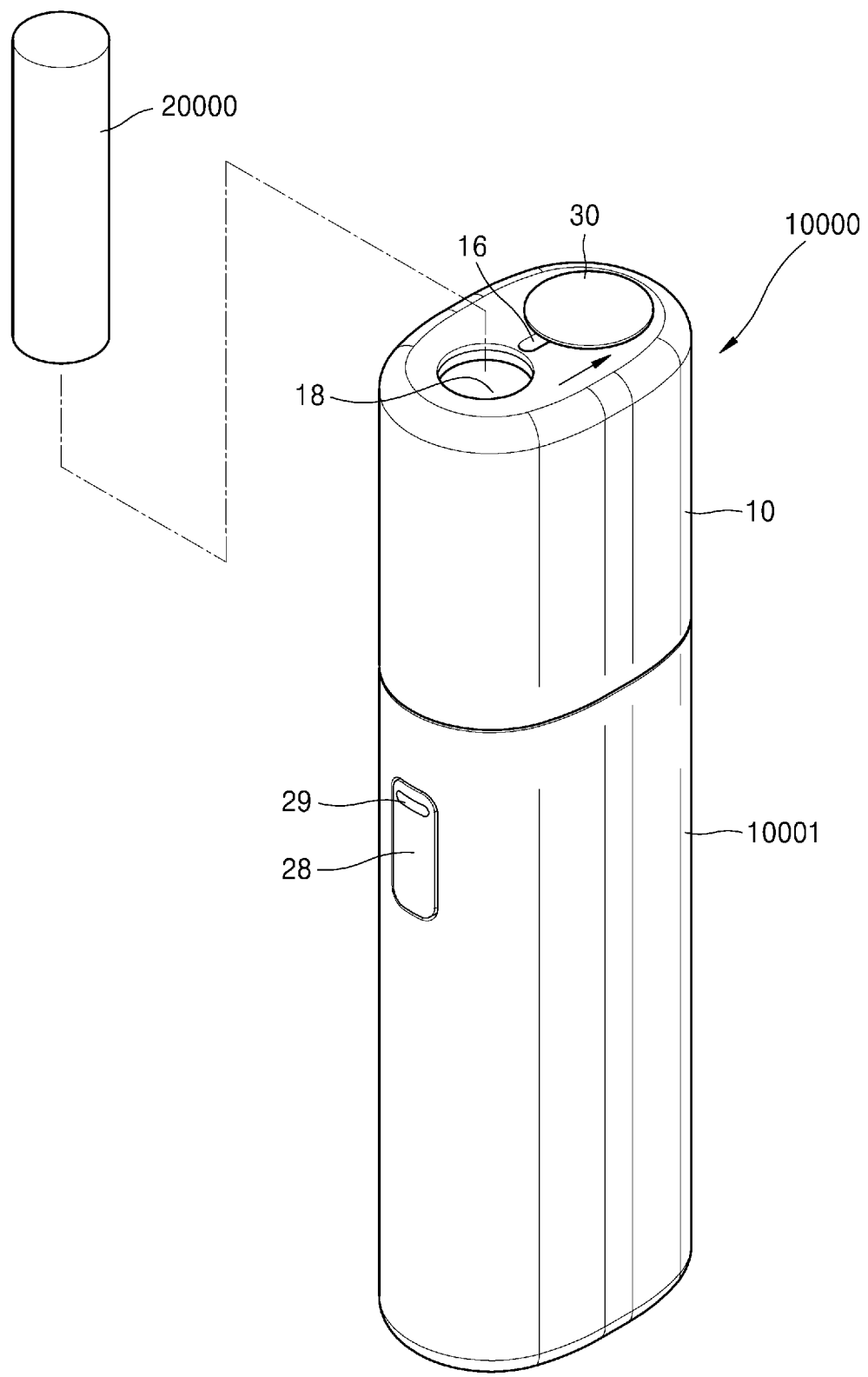
FIG. 4 is a perspective view of a state of operation of the aerosol generation device illustrated in FIG. 1.

FIG. 4 is a perspective view of a state of an operation of the aerosol generation device illustrated in FIG. 1.

An aerosol generation device 10000 related to the exemplary embodiment illustrated in FIG. 4 includes a case 10001 into which the cigarette 20000 is insertable. A covering 10 is coupled to an upper portion of the case 10001. The covering 10 is detachably coupled to the case 10001. A cover 30 is slidably installed on an upper surface of the covering 10.

A cigarette insertion hole 18 into which the cigarette 20000 is inserted is formed in the covering 10. As the cover 30 moves along a rail 16 formed on an upper surface of the covering 10, the cigarette insertion hole 18 may be exposed to the outside. While the cigarette insertion hole 18 is exposed to the outside, the cigarette 20000 may be inserted into the cigarette insertion hole 18.

A method of coupling the cover 30 to the covering 10 is not limited to the structure illustrated in F1G. 4, and for example, the cover 30 may be coupled to the covering 10 via a hinge, and open or close the cigarette insertion hole 18.

As the cover 30 slides over the upper surface of the covering 10, various preparation operations may be executed in connection with an operation of opening the cigarette insertion hole 18. For example, at a moment when the cover opens the cigarette insertion hole 18, a preliminary heating operation of heaters in the aerosol generation device 10000 or an operation of recognizing a user, or the like, may be performed.

A button 28 operable by a user and a light-emitting diode (LED) 29 for displaying an internal operating state of the aerosol generation device by emitting one of various preset colors are installed outside the case 10001 of the aerosol generation device 10000.

A controller mounted inside the aerosol generation device may indicate a 'normal operating state' by causing the LED 29 to emit light, based on conditions such as whether a heater is in an operable state and/or whether remaining battery power is sufficient.

The LED 29 emits light when the user presses the button 28, and thus, the user may identify a remaining amount of electric charge in a battery based on a color of light emission of the LED 29. For example, when the LED 29 emits green light, it may indicate that the amount of electric charge in the battery is sufficient. When the LED 29 emits red light, it may indicate that the amount of electric charge in the battery is insufficient.

Preset different operations may be performed according to a length of period of time that the user presses the button 28. For example, when the user presses the button 28 for longer than a pre-set pressing, time, a resetting operation of the aerosol generation device (initialization of settings) may be performed.

Figure 5:
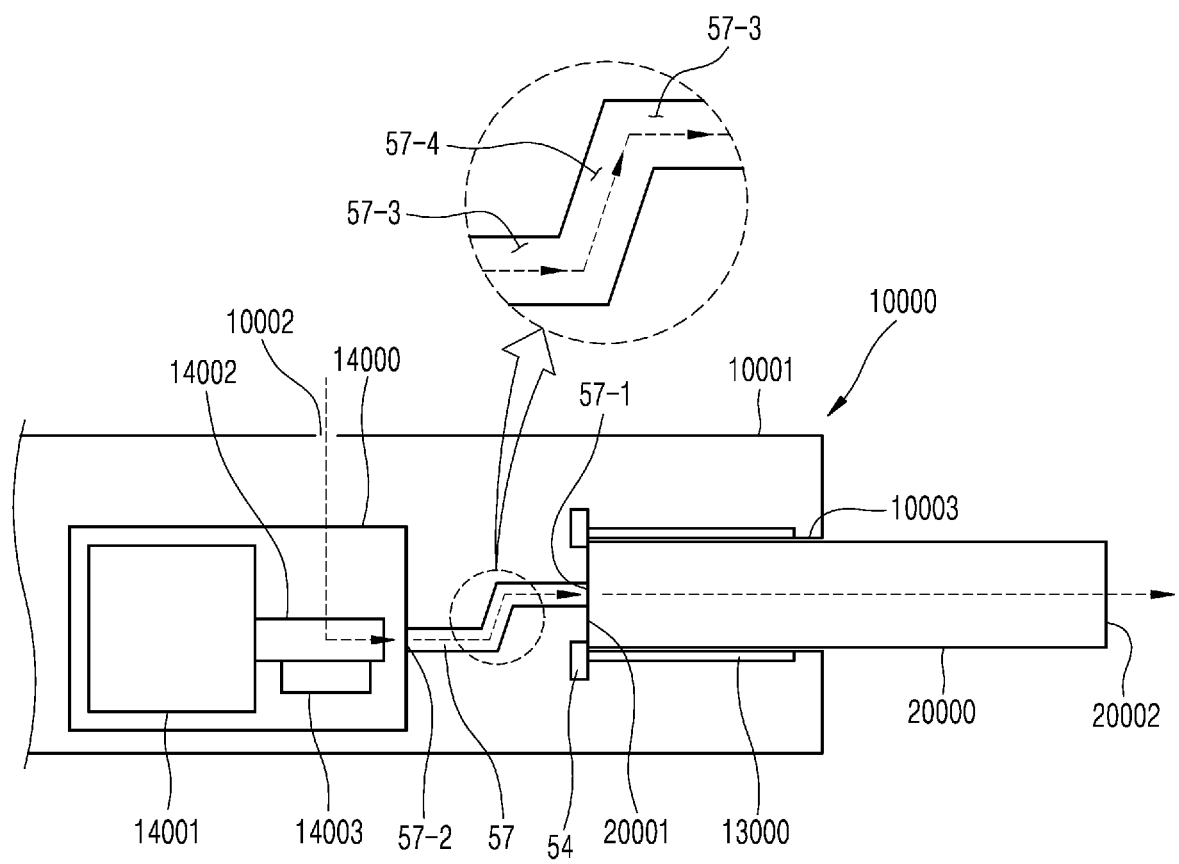
FIG. 5 is a schematic structural drawing of an aerosol generation device according to an exemplary embodiment of the present disclosure.

FIG. 5 illustrates a schematic structure of an aerosol generation device according to an exemplary embodiment of the present disclosure.

Referring to FIG. 5, the aerosol generation device 10000 includes the case 10001 forming the outer appearance. In the case 10001, an insertion portion 10003 into which the cigarette 20000 is inserted is provided.

Although not illustrated in the drawing, the aerosol generation device 10000 may include a pressure detecting sensor (not shown) for detecting a change in a pressure in the air inhaled to pass through the cigarette 20000. The pressure detecting sensor generates a signal by detecting an inhalation pressure which refers to a pressure of air generated by a user's operation of inhaling on the cigarette 20000 in his or her mouth (i.e., puff operation). A detection signal of the pressure detecting sensor is delivered to the controller 12000. By using the pressure detecting sensor, the controller 12000 may control the aerosol generation device 10000 to automatically end an operation of the vaporizer 14000 and the heater 13000 after a preset number of times of puffing (for example, 14 times).

In addition, also when the number of times of puffing has not reached a preset number of times (for example, 14 times), the controller 12000 may forcibly end an operation of the vaporizer 14000 and the heater 13000 after a pre-designated period of time (for example, six minutes) has passed.

As described above, in the aerosol generation device 10000 according to the present exemplary embodiment, the aerosol generated by the vaporizer 14000 passes through the cigarette 20000 to be delivered to the user. The vaporizer 14000 and the cigarette 20000 are connected via a mainstream smoke passage 57.

Reference numerals 14001, 14002, and 14003 respectively denote a liquid storage, a liquid delivery element, and a heating element heating a liquid.

The liquid storage 14001 may be in the form of a cartridge that is individually replaceable. The liquid storage 14001 may also have a structure that allows replenishment of the liquid. The vaporizer 14000 may also be in the form of a cartridge that is entirely replaceable.

The mainstream smoke passage 57 connects an internal end portion 20001 of the cigarette 20000 to the outside such that the external air may flow into the cigarette 20000 when the user puffs the cigarette 20000. The external air is inhaled into the case 10001 through an air vent 10002 provided in the case 10001.

The air passes through the vaporizer 14000. Aerosol generated by atomization of a liquid is included in the air that has passed through the vaporizer 14000. The air that has passed through the vaporizer 14000 flows into the internal end portion 20001 of the cigarette 20000, that is, the opposite end portion of the filter rod 22000 (see FIG. 3), through the mainstream smoke passage 57. The internal end portion 20001 of the cigarette 20000 is an end portion located inside the case 10001 and is supported by a stopper 54. The air passes through the tobacco rod 21000 and the filter rod 22000 to be inhaled by a smoker through an external end portion 20002.

Hereinafter, a configuration of the mainstream smoke passage 57 will be described in detail.

A first end portion 57-1 of the mainstream smoke passage 57 is connected to the internal end portion 20001 of the cigarette 20000, and a second end portion 57-2 of the mainstream. smoke passage 57 is connected to the vaporizer 14000. in addition, at least a portion of the mainstream smoke passage 57 extends in a direction crossing a longitudinal direction of the cigarette 20000. In detail, the mainstream smoke passage 57 includes a first mainstream smoke passage 57-3 extending in a direction in which the vaporizer 14000 and the cigarette 20000 are arranged in serial, and a second mainstream smoke passage 57-4 extending in a direction crossing the direction in which the first mainstream smoke passage 57-3 extends.

Meanwhile, although not illustrated in the drawing, the mainstream smoke passage 57 may also be formed to extend in a direction crossing the longitudinal direction of the cigarette 20000, that is, in an oblique direction from the first end portion 57-1 to the second end portion 57-2. Hereinafter, however, for convenience of description, the structures of the mainstream smoke passages 57, 157, 257, and 357 illustrated in FIGS. 5 through 12 will be explained.

The external air is introduced into the aerosol generation device 10000 through the air vent 10002, and the aerosol is added to the external air while the external air passes through the vaporizer 14000. Then, the air including the aerosol may be introduced into the mainstream smoke passage 57. The aerosol in a mainstream smoke that passes through the mainstream smoke passage 57 may be partially liquefied again in the mainstream smoke passage 57.

In general, a smoker uses the aerosol generation device 10000 while the first end portion 57-1 of the mainstream smoke passage 57 is positioned higher than the second end portion 57-2. Thus, the aerosol liquefied in the mainstream smoke passage 57 may flow down from the first end portion 57-1 to the second end portion 57-2 of the mainstream smoke passage 57. If a cross-section of a connecting portion between the first mainstream smoke passage 57-3 and the second mainstream smoke passage 57-4 (i.e., a cross-section of a bent portion of the mainstream smoke passage 57) is approximately at a right angle, the liquefied aerosol may remain in the bent portion of the mainstream smoke passage 57 and disturb the flow of the air in the mainstream smoke passage 57.

To prevent performance degradation of the aerosol generation device 10000 due to the re-liquefied aerosol remaining in the mainstream smoke passage 57, the aerosol generation device 10000 according to the exemplary embodiment of the present disclosure illustrated in FIG. 5 may include the second mainstream smoke passage 57-4 extending in a direction crossing the longitudinal direction of the cigarette.

According to this structure, the aerosol liquefied in the mainstream smoke passage 57 does not get stuck or remain in the connecting portion between the first mainstream smoke passage 57-3 and the second mainstream smoke passage 57-4, that is, in the bent portion of the mainstream smoke passage 57, but may easily flow along the second mainstream smoke passage 57-4 to the second end portion 57-2 of the mainstream smoke passage 57. The liquefied aerosol that has flowed down to the second end portion 57-2 may be heated again by the heating element 14003 to be aerosolized, and thus, without using an additional cleaning tool, the aerosol in a liquid state may be prevented from remaining in the mainstream smoke passage 57.

Figure 6:
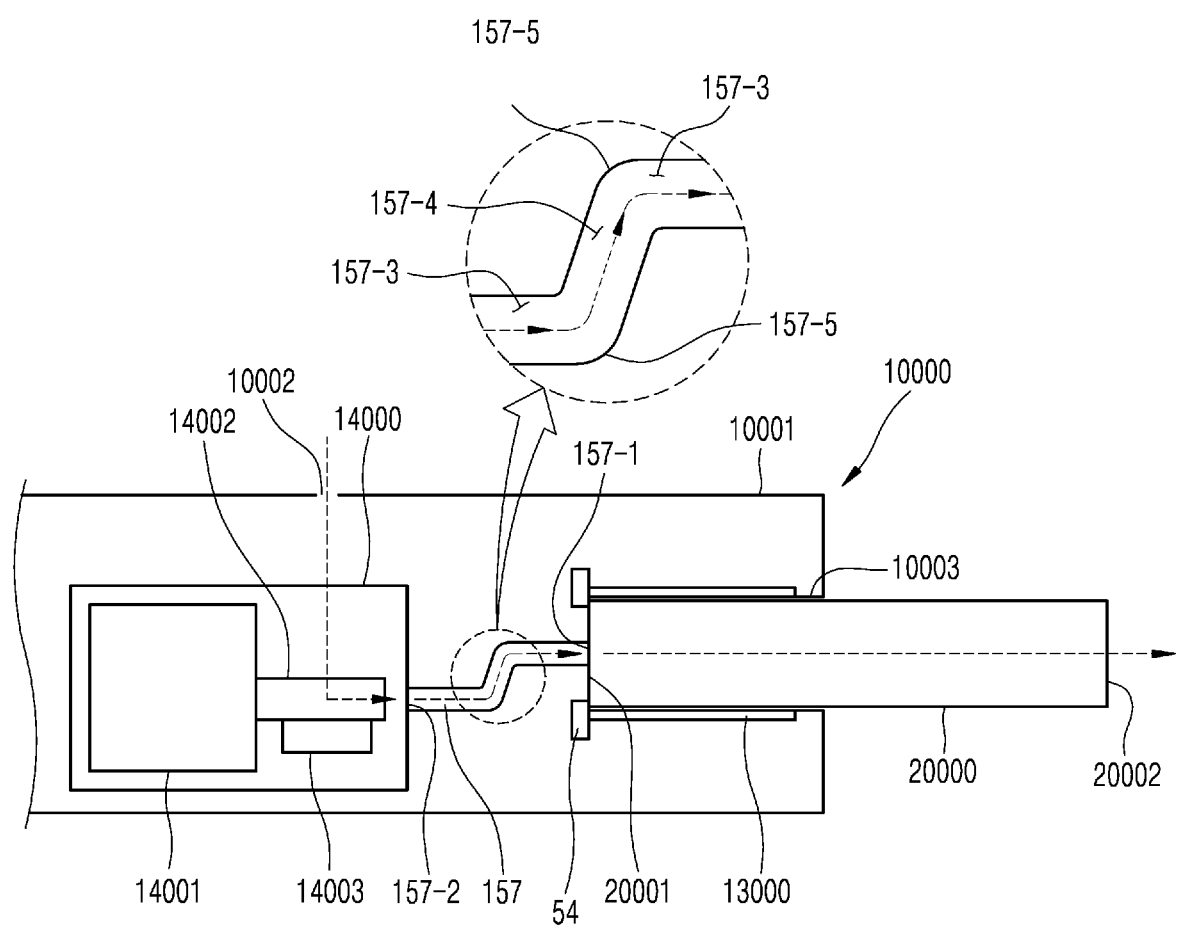
FIG. 6 is a structural drawing illustrating a modified example of a mainstream smoke passage illustrated in FIG. 5.

FIG. 6 illustrates a structure of a modified example of the mainstream smoke passage illustrated in FIG. 5.

Referring to FIG. 6, a first end portion 157-1 of the mainstream smoke passage 157 is connected to the internal end portion 20001 of the cigarette 20000, and a second end portion 157-2 of the mainstream smoke passage 157 is connected to the vaporizer 14000. In addition, the mainstream smoke passage 157 includes a first mainstream smoke passage 157-3 extending in a direction in which the vaporizer 14000 and the cigarette 20000 are arranged in serial and a second mainstream smoke passage 157-4 extending in a direction crossing the direction in which the first mainstream smoke passage 157-3 extends.

The external air that is introduced into the aerosol generation device 10000 through the air vent 10002, and aerosol is added to the external air while the external air passes through the vaporizer 14000. Then, the air including the aerosol may be introduced into the mainstream smoke passage 157. The aerosol in a mainstream smoke that passes by the ma mainstream smoke passage 157 may be partially liquefied in the mainstream smoke passage 157.

In general, a smoker uses the aerosol generation device 10000 while the first end portion 157-1 of the mainstream smoke passage 157 is positioned higher than the second end portion 157-2. Thus, the aerosol liquefied in the mainstream smoke passage 157 may flow down from the first end portion 157-1 to the second end portion 157-2 of the mainstream smoke passage 157. Accordingly, if a cross-section of a connecting portion between the first mainstream smoke passage 157-3 and the second mainstream smoke passage 157-4 (i.e., a bent portion of the mainstream smoke passage 157) is approximately at a right angle, the liquefied aerosol may cumulatively remain in the bent portion of the mainstream smoke passage 157.

To prevent performance degradation of the aerosol generation device 10000 due to the re-liquefaction of the aerosol in the mainstream smoke passage 157, the aerosol generation device 10000 according to the exemplary embodiment of the present disclosure illustrated in FIG. 6 may further include a rounded surface 157-5 formed on the connecting portion between the first mainstream smoke passage 157-3 and the second mainstream smoke passage 157-4.

According to this structure, the aerosol liquefied in the mainstream smoke passage 157 does not get stuck or remain in the connecting portion between the first mainstream smoke passage 157-3 and the second mainstream smoke passage 157-4 (i.e., the bent portion of the mainstream smoke passage 157), and may easily flow to the second end portion 157-2 of the mainstream smoke passage 157. The liquefied aerosol that has flowed down to the second end portion 157-2 may be heated again by the heating element 14003 to be aerosolized, and thus, without using an additional cleaning tool, the aerosol in a liquid state may be prevented from remaining in the mainstream smoke passage 157.

Figure 7:
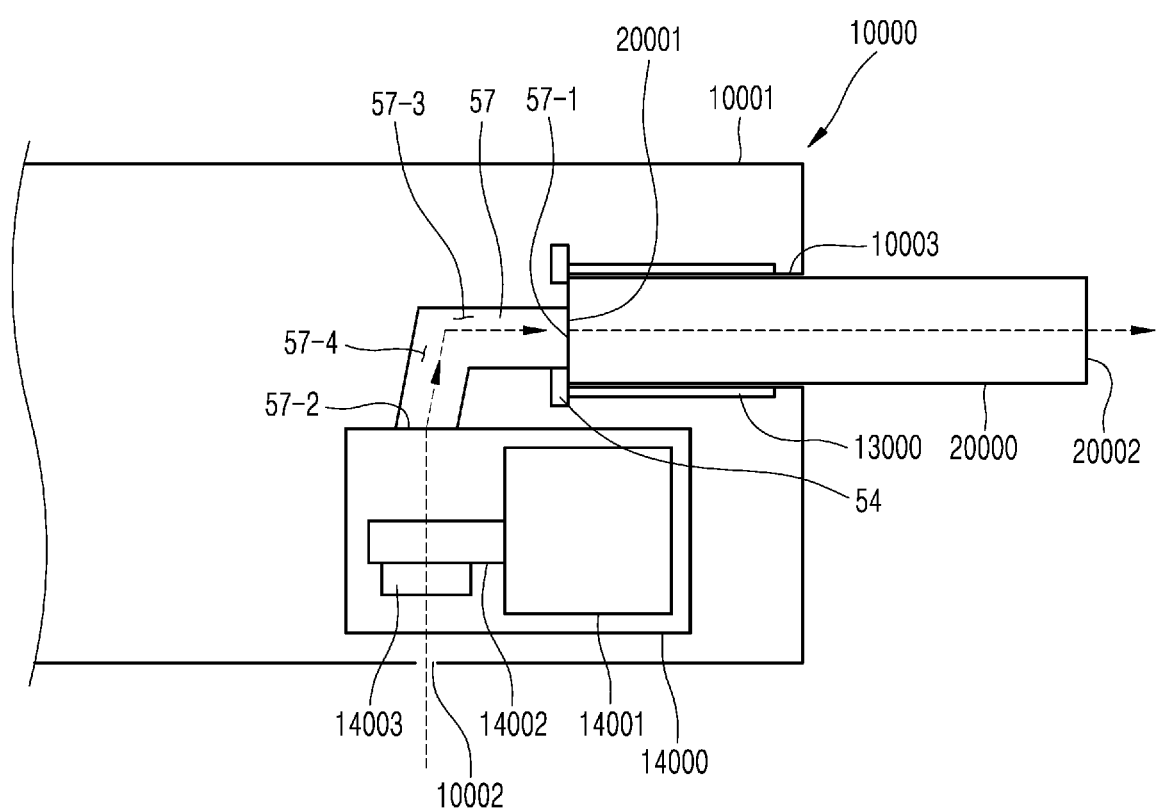
FIG. 7 is a structural drawing illustrating the mainstream smoke passage of FIG. 5 applied to a structure in which a cigarette and a vaporizer are arranged in parallel.
Figure 8:
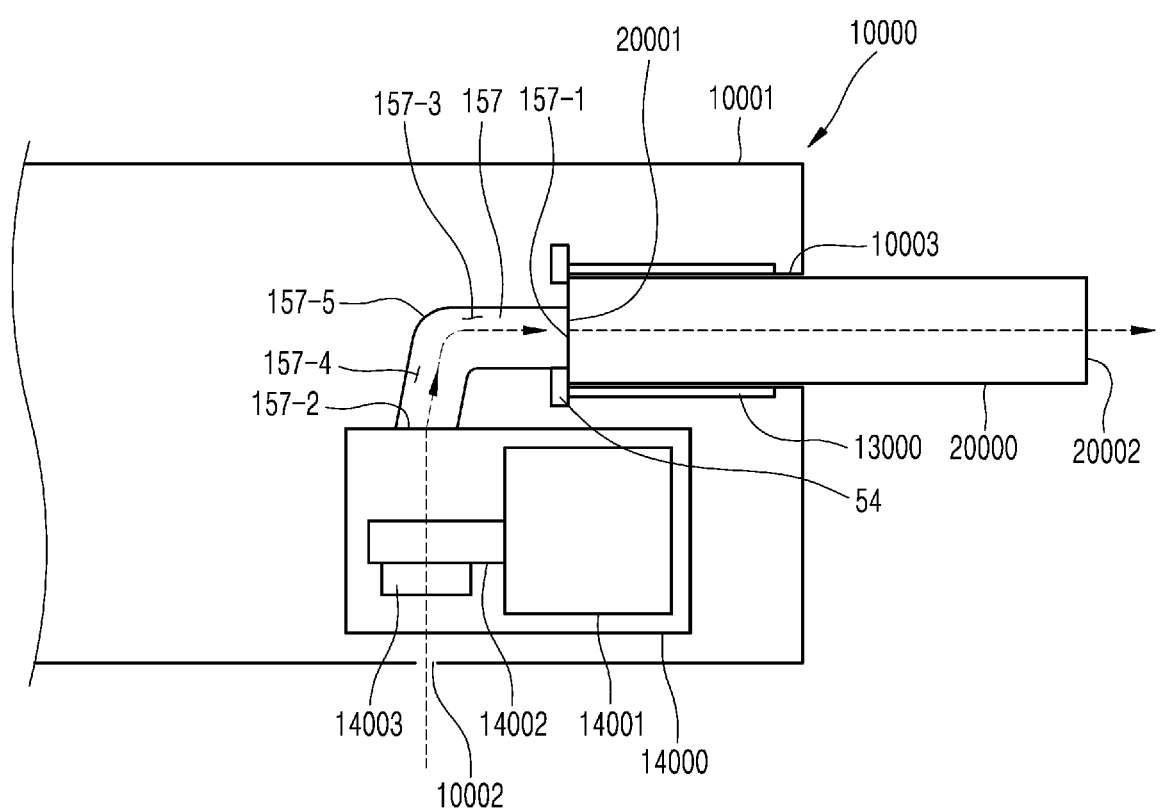
FIG. 8 is a structural drawing illustrating the mainstream smoke passage of FIG. 6 applied to a structure in which a cigarette and a vaporizer are arranged in parallel.

FIG. 7 illustrates the mainstream smoke passage of FIG. 5 applied to a structure in which a cigarette and a vaporizer are arranged in parallel. FIG. 8 illustrates the mainstream smoke passage of FIG. 6 applied to a structure in which a cigarette and a vaporizer are arranged in parallel.

As illustrated in FIG. 7, the structure of the mainstream smoke passage 57 illustrated in FIG. 5 may also apply to the structure of the aerosol generation device 10000 illustrated in FIG. 2, in which the cigarette 20000 and the vaporizer 14000 are arranged in parallel.

Also, as illustrated in FIG. 8, the structure of the mainstream smoke passage 157 illustrated in FIG. 6 may also apply to the structure of the aerosol generation device 10000 illustrated in FIG. 2, in which the cigarette 20000 and the vaporizer 14000 are arranged in parallel.

Figure 9:
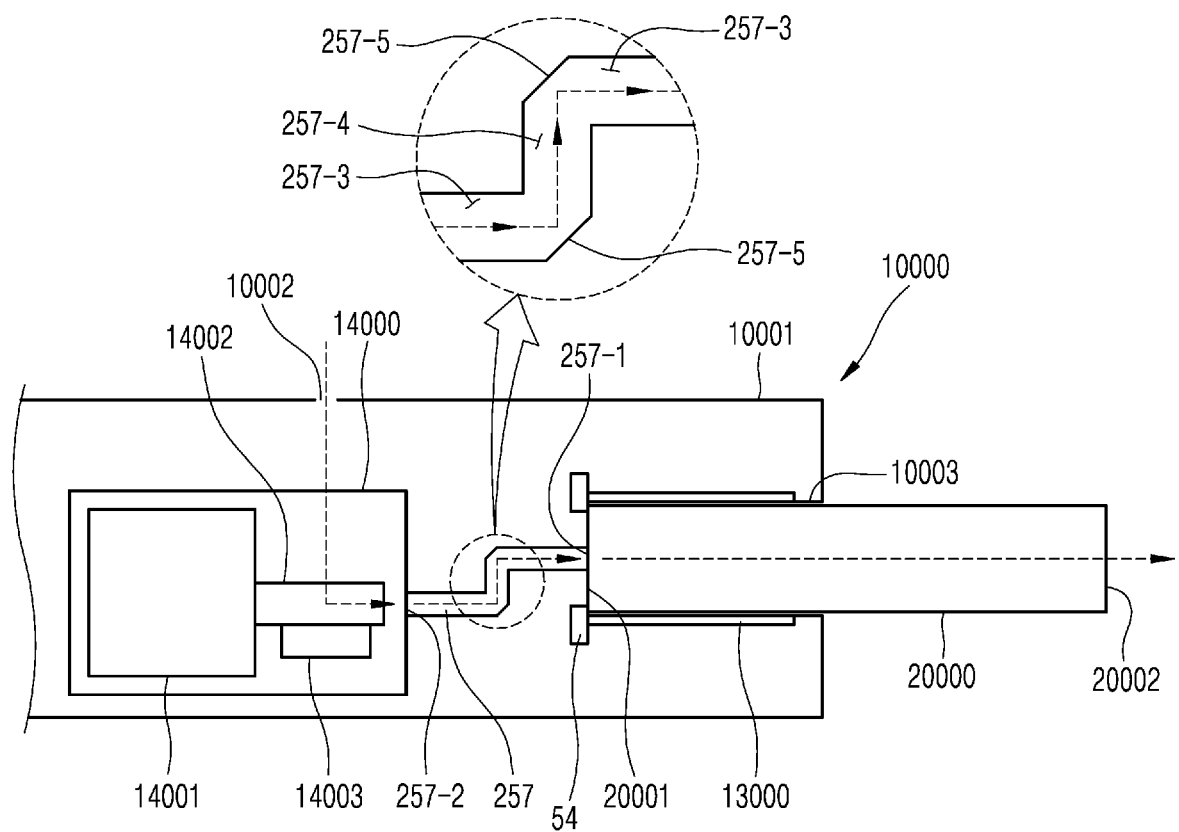
FIG. 9 is a schematic structural drawing of an aerosol generation device according to another exemplary embodiment of the present disclosure.

FIG. 9 illustrates a schematic structure of an aerosol generation device according to another exemplary embodiment of the present disclosure.

Referring to FIG. 9, a first end portion 257-1 of the mainstream smoke passage 257 is connected to the internal end portion 20001 of the cigarette 20000, and a second end portion 257-2 of the mainstream smoke passage 257 is connected to the vaporizer 14000, In addition, the mainstream smoke passage 257 includes a first mainstream smoke passage 257-3 extending in a direction in which the vaporizer 14000 and the cigarette 20000 are arranged in serial and a second mainstream smoke passage 257-4 extending in a direction orthogonal to the direction in which the first mainstream smoke passage 257-3 extends.

The external air is introduced into the aerosol generation device 10000 through the air vent 10002. The aerosol is added to the external air while the external air passes through the vaporizer 14000. Then, the external air including the aerosol may be introduced into the mainstream smoke passage 257. The aerosol in a mainstream smoke that passes through the mainstream smoke passage 257 may be partially liquefied in the mainstream smoke passage 257.

In general, a smoker uses the aerosol generation device 10000 while the first end portion 257-1 of the mainstream smoke passage 257 is positioned higher than the second end portion 257-2. Thus, the aerosol liquefied in the mainstream smoke passage 257 may flow down from the first end portion 257-1 to the second end portion 257-2 of the mainstream smoke passage 257. Accordingly, if a cross-section of a connecting portion between the first mainstream smoke passage 257-3 and the second mainstream smoke passage 257-4 (i.e., a cross-section of a bent portion of the mainstream smoke passage 257) is approximately at a right angle, the liquefied aerosol may cumulatively remain in the bent portion of the mainstream smoke passage 257.

To prevent performance degradation of the aerosol generation device 10000 due to the re-liquefied aerosol remaining in the mainstream smoke passage 257, the aerosol generation device 10000 according to the exemplary embodiment of the present disclosure illustrated in FIG. 9 may include an inclined surface 257-5 formed on the connecting portion between the first mainstream smoke passage 257-3 and the second mainstream smoke passage 257-4.

According to this structure, the aerosol liquefied in the mainstream smoke passage 257 does not get stuck or remain in the connecting portion between the first mainstream smoke passage 257-3 and the second mainstream smoke passage 257-4 (i.e., in the bent portion of the mainstream smoke passage 257), and may easily flow to the second end portion 257-2 of the mainstream smoke passage 257. The liquefied aerosol that has flowed to the second end portion 257-2 may be heated again by the heating element 14003 to be to be aerosolized, and thus, without using an additional cleaning tool, the aerosol in a liquid state may be prevented from remaining in the mainstream smoke passage 257.

Figure 10:
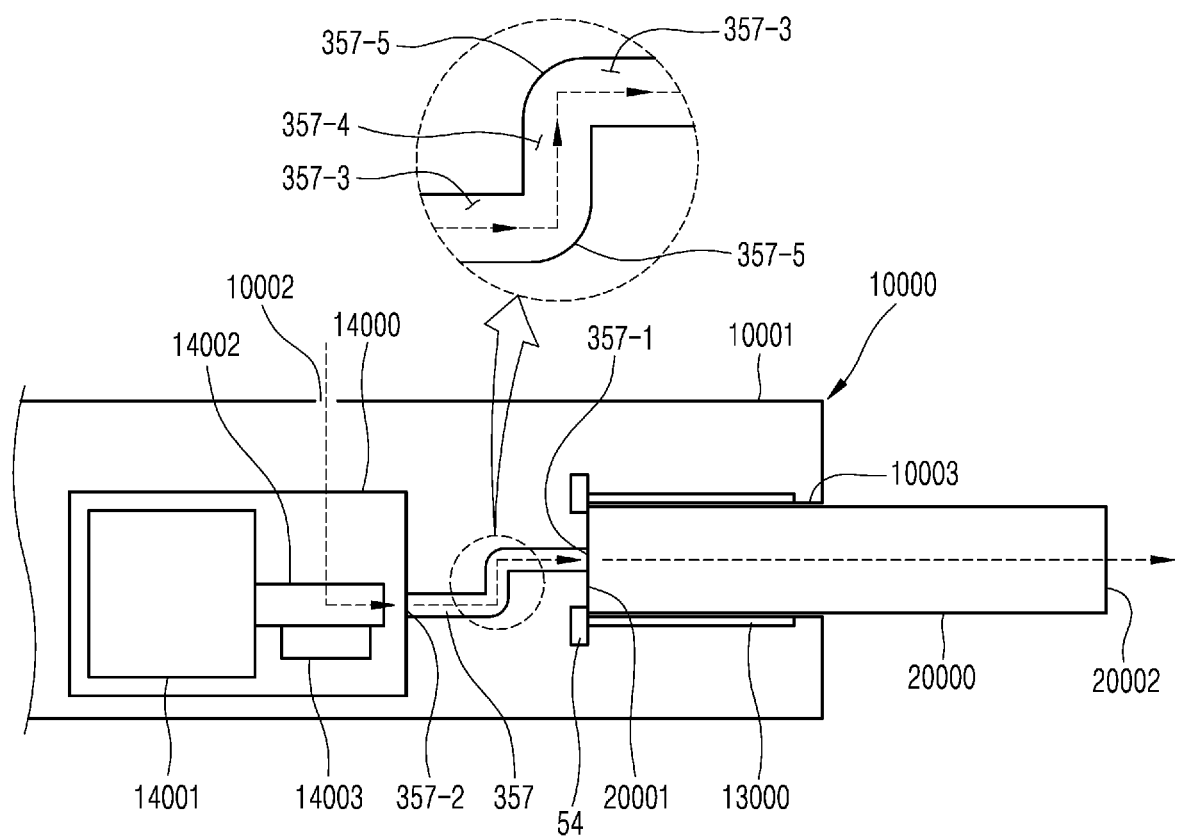
FIG. 10 is a structural drawing illustrating a modified example of a mainstream smoke passage illustrated in FIG. 9.

FIG. 10 illustrates a structure of a modified example of the mainstream smoke passage illustrated in FIG. 9.

Referring to FIG. 10, a first end portion 357-1 of the mainstream smoke passage 357 is connected to the internal end portion 20001 of the cigarette 20000, and a second end portion 357-2 of the mainstream smoke passage 357 connected to the vaporizer 14000. In addition, the mainstream smoke passage 357 includes a first mainstream smoke passage 357-3 extending in a direction in which the vaporizer 14000 and the cigarette 20000 are arranged in serial, and a second mainstream smoke passage 357-4 extending in a direction orthogonal to the direction in which the first mainstream smoke passage 357-3 extends.

The external air is introduced into the aerosol generation device 10000 through the air vent 10002, and the aerosol is added to the external air while the external passes through the vaporizer 14000. Then, the external air including the aerosol may be introduced into the mainstream smoke passage 357. The aerosol in a mainstream smoke passing through the mainstream smoke passage 357 may be partially liquefied in the mainstream smoke passage 357.

In general, a smoker uses the aerosol generation device 10000 while the first end portion 357-1 of the mainstream smoke passage 357 is positioned higher than the second end portion 357-2. Thus, the aerosol liquefied in the mainstream smoke passage 357 may flow down from the first end portion 357-1 to the second end portion 357-2 of the mainstream smoke passage 357. Accordingly, if a cross-section of a connecting portion between the first mainstream smoke passage 357-3 and the second mainstream smoke passage 357-4 (i.e., a cross-section of a bent portion of the mainstream smoke passage 357) is approximately at a right angle, the liquefied aerosol may cumulatively remain in the bent portion of the mainstream smoke passage 357.

To prevent performance degradation of the aerosol generation device 10000 due to the re-liquefied aerosol remaining in the mainstream smoke passage 357, the aerosol generation device 10000 according to the exemplary embodiment of the present disclosure illustrated in FIG. 10 may further include a rounded surface 357-5 formed on the connecting portion between the first mainstream smoke passage 357-3 and the second mainstream smoke passage 357-4.

According to this structure, the aerosol liquefied in the mainstream smoke passage 357 does not get stuck or remain in the connecting portion between the first mainstream smoke passage 357-3 and the second mainstream smoke passage 357-4 (i.e., in the bent portion of the mainstream smoke passage 357), and may easily flow to the second end portion 357-2 of the mainstream smoke passage 357. The liquefied aerosol that has flowed to the second end portion 357-2 may be heated again by the heating element 14003 to be aerosolized, and thus, without using an additional cleaning tool, the aerosol in a liquid state may be prevented from remaining in the mainstream smoke passage 357.

Figure 11:
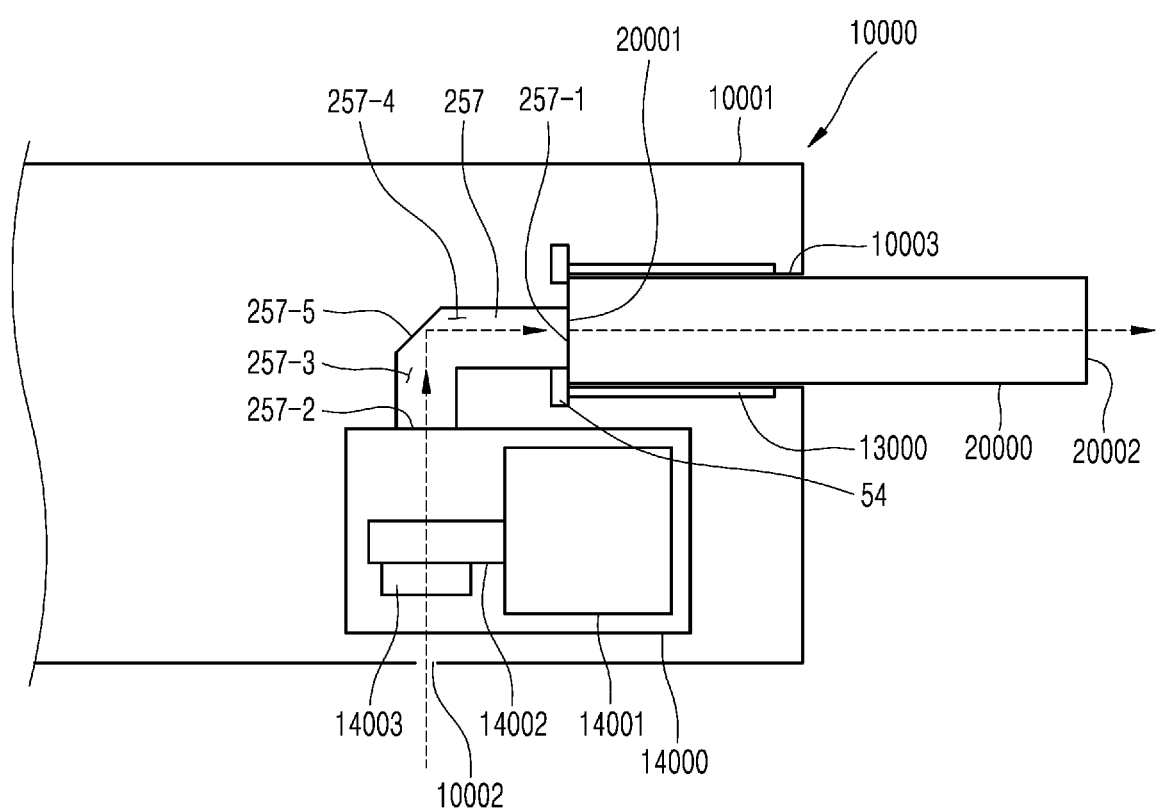
FIG. 11 is a structural drawing illustrating the mainstream smoke passage of FIG. 9 applied to a structure in which a cigarette and a vaporizer are arranged in parallel.
Figure 12:
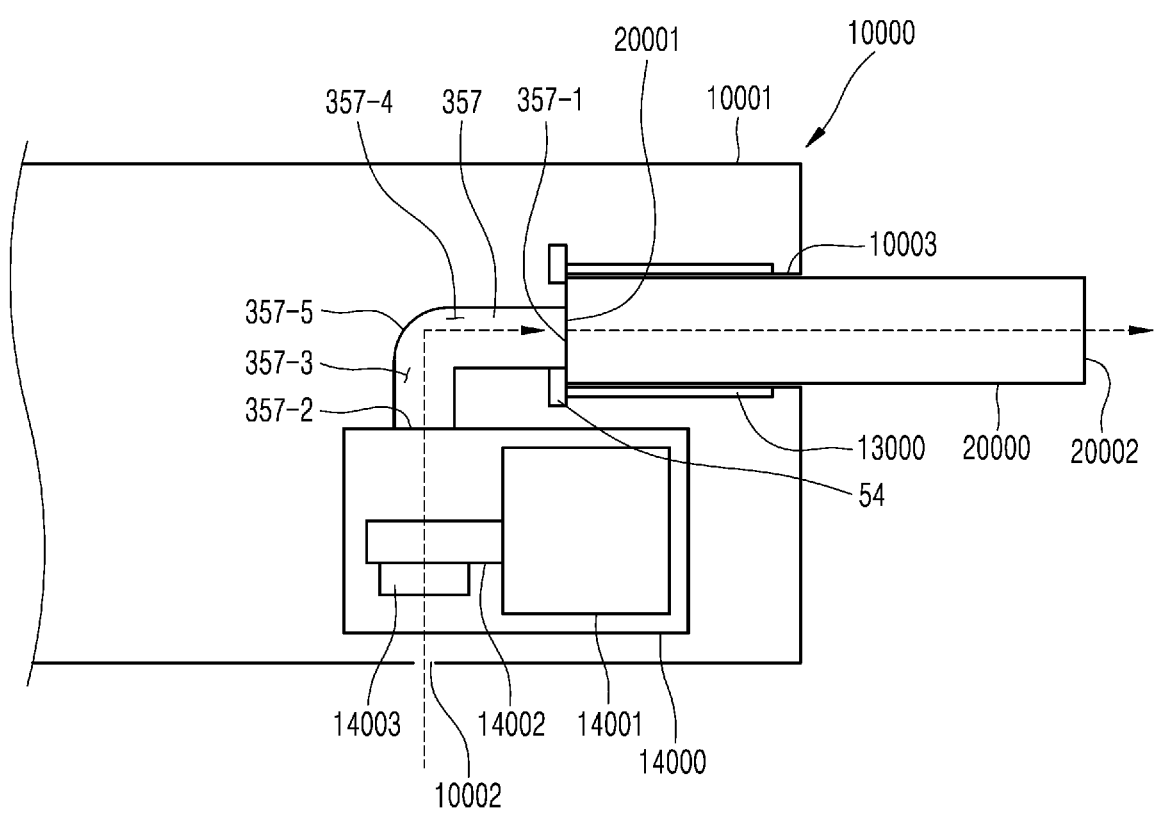
FIG. 12 is a structural drawing illustrating the mainstream smoke passage of FIG. 10 applied to a structure in which a cigarette and a vaporizer are arranged in parallel.

FIG. 11 illustrates a structure of the mainstream smoke passage of FIG. 9 applied to a structure in which a cigarette and a vaporizer are arranged in parallel. FIG. 12 illustrates a structure of the mainstream smoke passage of FIG. 10 applied to a structure in which a cigarette and a vaporizer are arranged in parallel.

As illustrated in FIG. 11, the structure of the mainstream smoke passage 257 illustrated in FIG. 9 may also apply to the structure of the aerosol generation device 10000 illustrated in FIG. 2, in which the cigarette 20000 and the vaporizer 14000 are arranged in parallel.

Also, as illustrated in FIG. 12, the structure of the mainstream smoke passage 357 illustrated in FIG. 10 may also apply to the structure of the aerosol generation device 10000 illustrated in FIG. 2, in which the cigarette 20000 and the vaporizer 14000 are arranged in parallel. While the present disclosure has been particularly shown and described with reference to exemplary embodiments thereof, it will be understood by those of ordinary skill in the art that various changes in form and details may be made therein. Therefore, the scope of the present disclosure shall be defined by the appended claims.

What is claimed is:

1. An aerosol generation device comprising:
   a case into which a cigarette is insertable;
   a heater arranged in the case and configured to heat the cigarette inserted into the case; and
   a mainstream smoke passage connecting an internal end portion of the cigarette to a vaporizer,
   wherein the vaporizer is configured to generate aerosol by heating a liquid composition and deliver the aerosol to the mainstream smoke passage, and
   wherein the mainstream smoke passage comprises:
      a first mainstream smoke passage extending in a longitudinal direction of the cigarette; and
      a second mainstream smoke passage extending in a direction inclined with respect to a direction in which the first mainstream smoke passage extends.

2. The aerosol generation device of claim 1, wherein the mainstream smoke passage is connected to the cigarette through a first end portion and is connected to the vaporizer through a second end portion that is opposite to the first end portion.

3. The aerosol generation device of claim 1, wherein an inclined surface formed to be inclined with respect to the longitudinal direction of the cigarette is formed in a connecting portion between the first mainstream smoke passage and the second mainstream smoke passage.

4. The aerosol generation device of claim 1, wherein a rounded surface is formed in a connecting portion between the first mainstream smoke passage and the second mainstream smoke passage.

5. The aerosol generation device of claim 1, wherein the heater and the vaporizer are arranged in series in the longitudinal direction of the cigarette.

6. The aerosol generation device of claim 1, wherein the heater and the vaporizer are arranged in parallel with respect to the longitudinal direction of the cigarette.

* * * * *